(12) United States Patent
Hashimoto et al.

(10) Patent No.: US 11,978,586 B2
(45) Date of Patent: May 7, 2024

(54) SUPERCONDUCTING MAGNET DEVICE

(71) Applicant: SUMITOMO HEAVY INDUSTRIES, LTD., Tokyo (JP)

(72) Inventors: Atsushi Hashimoto, Yokosuka (JP); Jyun Yoshida, Yokosuka (JP); Kenta Demura, Yokosuka (JP); Takaaki Morie, Yokosuka (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 17/648,290

(22) Filed: Jan. 18, 2022

(65) Prior Publication Data

US 2022/0230792 A1    Jul. 21, 2022

(30) Foreign Application Priority Data

Jan. 18, 2021   (JP) ................................ 2021-005646

(51) Int. Cl.
*H01F 6/06*      (2006.01)
*H01F 6/04*      (2006.01)

(52) U.S. Cl.
CPC ................... *H01F 6/06* (2013.01); *H01F 6/04* (2013.01)

(58) Field of Classification Search
CPC .................................. H01F 6/06; H01F 6/00
USPC ......................................................... 335/216
See application file for complete search history.

(56) References Cited

U.S. PATENT DOCUMENTS

| 3,242,418 A | * | 3/1966 | Mela | ...................... | H02K 55/04 |
| | | | | | 310/11 |
| 3,582,851 A | * | 6/1971 | Meservey | ................. | H01F 6/00 |
| | | | | | 505/880 |
| 4,509,030 A | * | 4/1985 | Vermilyea | ................. | H01F 6/06 |
| | | | | | 505/879 |
| 4,535,291 A | * | 8/1985 | Lee | ..................... | G01R 33/3815 |
| | | | | | 335/216 |
| 4,851,958 A | * | 7/1989 | Takechi | ............. | G01R 33/3815 |
| | | | | | 335/216 |
| 6,014,069 A | * | 1/2000 | Havens | .............. | G01R 33/3875 |
| | | | | | 324/318 |

(Continued)

FOREIGN PATENT DOCUMENTS

| JP | 2004051475 A | 2/2004 |
| JP | 2007184383 A | 7/2007 |

(Continued)

*Primary Examiner* — Alexander Talpalatski
(74) *Attorney, Agent, or Firm* — HEA LAW PLLC

(57) ABSTRACT

A superconducting magnet device includes a tubular cryostat defining a central cavity therein, a first superconducting coil set and a second superconducting coil set disposed outside the central cavity and inside the tubular cryostat, and a power supply system being capable of controlling a magnitude of a first exciting current to the first superconducting coil set and a magnitude of a second exciting current to the second superconducting coil set independently of each other. The first superconducting coil set generates a magnetic field distribution, which is convex downward on an X axis and convex upward on a Y axis when the first exciting current is supplied, in the central cavity. The second superconducting coil set generates a magnetic field distribution, which is convex upward on the X axis and convex downward on the Y axis when the second exciting current is supplied, in the central cavity.

9 Claims, 7 Drawing Sheets

(56) References Cited

U.S. PATENT DOCUMENTS

| | | | | |
|---|---|---|---|---|
| 6,984,264 | B2* | 1/2006 | Shimonosono | C30B 15/305 |
| | | | | 117/917 |
| 8,570,127 | B2* | 10/2013 | Wang | H01F 6/04 |
| | | | | 335/216 |
| 2004/0107894 | A1* | 6/2004 | Shimonosono | C30B 15/305 |
| | | | | 117/917 |
| 2007/0057581 | A1* | 3/2007 | Miner | H02K 55/00 |
| | | | | 318/599 |
| 2007/0146107 | A1* | 6/2007 | Lvovsky | G01R 33/3875 |
| | | | | 335/296 |
| 2008/0084262 | A1* | 4/2008 | Beasley | G01R 33/3875 |
| | | | | 335/216 |
| 2011/0221552 | A1* | 9/2011 | Rochford | H01F 6/06 |
| | | | | 62/51.1 |
| 2012/0289406 | A1* | 11/2012 | Wang | H01F 6/06 |
| | | | | 335/216 |
| 2013/0237426 | A1* | 9/2013 | Tamura | H01F 6/04 |
| | | | | 505/211 |

FOREIGN PATENT DOCUMENTS

| | | | |
|---|---|---|---|
| JP | 2017206396 A | 11/2017 | |
| JP | 2020522457 A | 7/2020 | |

* cited by examiner

SUPERCONDUCTING MAGNET DEVICE

RELATED APPLICATIONS

The content of Japanese Patent Application No. 2021-005646, on the basis of which priority benefits are claimed in an accompanying application data sheet, is in its entirety incorporated herein by reference.

BACKGROUND

Technical Field

Certain embodiments relate to a superconducting magnet device.

Description of Related Art

Superconducting magnet devices are used as magnetic field generation sources of single crystal pulling devices by the magnetic field applied Czochralski (MCZ) method. A strong magnetic field generated by a superconducting magnet can suppress heat convection in the melt of a semiconductor material. A magnetic field distribution to be applied affects the degree of suppression of heat convection, and as a result, the oxygen concentration in the single crystal to be pulled changes. The desired oxygen concentration varies depending on the applications of semiconductor devices that are ultimately manufactured. Thus, in the related art, a single crystal pulling device is known in which the directions of currents flowing through some superconducting coils are switched in order to switch between two types of different magnetic field distributions.

SUMMARY

According to an embodiment of the present invention, there is provided a superconducting magnet device including a tubular cryostat that defines a central cavity therein, a first superconducting coil set and a second superconducting coil set that are disposed outside the central cavity and inside the tubular cryostat, and a power supply system that is capable of controlling a magnitude of a first exciting current to the first superconducting coil set and a magnitude of a second exciting current to the second superconducting coil set independently of each other. When a center axis of the tubular cryostat is defined as a Z axis and two axes perpendicular to the Z axis and perpendicular to each other are defined as an X axis and a Y axis, respectively, the first superconducting coil set generates a magnetic field distribution, which is convex downward on the X axis and convex upward on the Y axis when the first exciting current is supplied, in the central cavity, and the second superconducting coil set generates a magnetic field distribution, which is convex upward on the X axis and convex downward on the Y axis when the second exciting current is supplied, in the central cavity.

DETAILED DESCRIPTION

Figure 1:
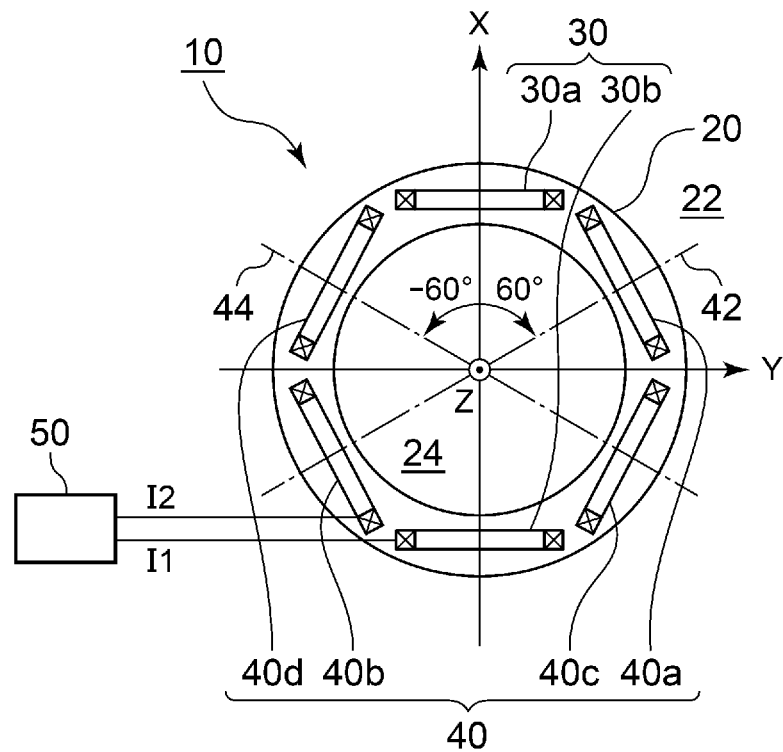
FIG. 1 is a sectional view schematically showing main parts of a superconducting magnet device according to an embodiment.

It is desirable to provide a superconducting magnet device capable of more finely controlling a magnetic field distribution to be generated.

In addition, optional combinations of the above constituent elements and those obtained by substituting the constituent elements or expressions of the present invention with each other among methods, devices, systems, and the like are also effective as embodiments of the present invention.

Hereinafter, embodiments for carrying out the present invention will be described in detail with reference to the drawings. In the description and drawings, the same or equivalent components, members, and processing are designated by the same reference numerals, and redundant descriptions will be appropriately omitted. The scales and shapes of the respective parts shown in the figures are set for convenience in order to facilitate the description, and should not be interpreted as limiting unless otherwise specified. The embodiments are merely examples and do not limit the scope of the present invention. All the features and combinations described in the embodiments are not necessarily essential to the invention.

Figure 2:
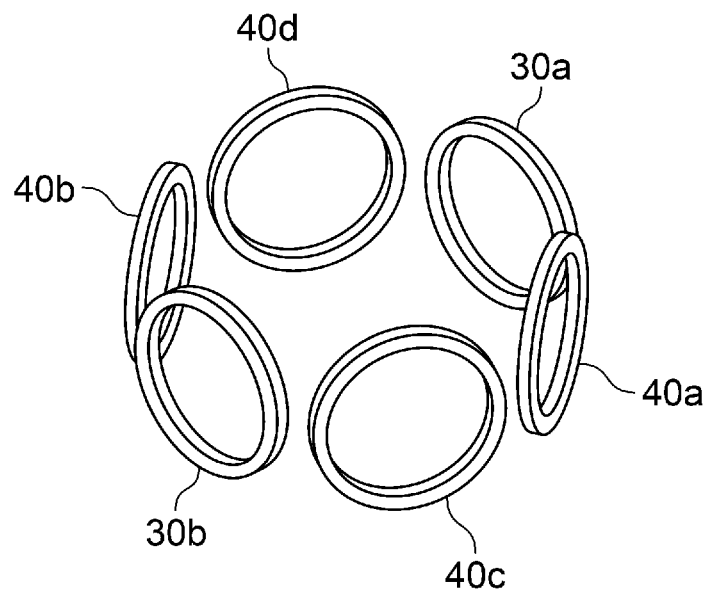
FIG. 2 is a perspective view schematically showing the disposition of a superconducting coil provided in the superconducting magnet device shown in FIG. 1.

FIG. 1 is a sectional view schematically showing main parts of a superconducting magnet device 10 according to an embodiment. Additionally, FIG. 2 is a perspective view schematically showing the disposition of a superconducting coil provided in the superconducting magnet device 10 shown in FIG. 1.

The superconducting magnet device 10 can be used as a magnetic field generation source for a single crystal pulling device by the horizontal magnetic field type MCZ (HMCZ; Horizontal-MCZ) method. The single crystal pulling device is, for example, a silicon single crystal pulling device.

As shown in FIG. 1, the superconducting magnet device 10 includes a tubular cryostat 20, a first superconducting coil set 30, a second superconducting coil set 40, and a power supply system 50.

The tubular cryostat 20 has an internal space isolated from a surrounding environment 22 surrounding the tubular cryostat 20, and the first superconducting coil set 30 and the second superconducting coil set 40 are disposed in the internal space. The internal space has, for example, a donut shape or cylindrical shape. The tubular cryostat 20 is an adiabatic vacuum vessel, and during the operation of the superconducting magnet device 10, a cryogenic vacuum environment suitable for bringing the first superconducting coil set 30 and the second superconducting coil set 40 into a superconductive state is provided in the internal space of the tubular cryostat 20. The tubular cryostat 20 is formed of a metallic material such as stainless steel or other suitable high-strength material to withstand ambient pressure (for example, atmospheric pressure).

The tubular cryostat 20 defines a central cavity 24 inside. The first superconducting coil set 30 and the second superconducting coil set 40 are disposed to surround the central cavity 24 outside the central cavity 24. When the superconducting magnet device 10 is mounted on the single crystal pulling device, a crucible for accommodating the melt of a single crystal material is disposed in the central cavity 24. The central cavity 24 is a part of the surrounding environment 22 surrounding the tubular cryostat 20 (that is, outside the tubular cryostat 20), and is, for example, a columnar space surrounded by the tubular cryostat 20.

In the following, for convenience of explanation, a Cartesian coordinate system will be considered in which a center axis of the tubular cryostat 20 is the Z axis and two axes perpendicular to the Z axis and perpendicular to each other are defined as an X axis and a Y axis, respectively. In the case of the single crystal pulling device, a crystal pulling axis corresponds to the Z axis, and the X axis and the Y axis can be defined on a melt surface perpendicular to the crystal pulling axis. In this case, a direction parallel to the magnetic field generated by the superconducting magnet device 10 at the center of the melt surface can be the X axis, and a direction perpendicular to the X axis can be the Y axis. FIG. 1 shows a section of the superconducting magnet device 10 on an XY plane, and the Z axis extends in a direction perpendicular to the paper plane.

Although the details will be described below, the first superconducting coil set 30 generates a magnetic field distribution, which becomes convex downward on the X axis and convex upward on the Y axis when a first exciting current I1 is supplied from the power supply system 50, in the central cavity 24. When a second exciting current I2 is supplied from the power supply system 50, the second superconducting coil set 40 generates a magnetic field distribution, which becomes convex upward on the X axis and convex downward on the Y axis, in the central cavity 24.

The power supply system 50 is provided as a power supply for the first superconducting coil set 30 and the second superconducting coil set 40 and is disposed outside the tubular cryostat 20. The power supply system 50 is configured so that a magnitude of the first exciting current I1 to the first superconducting coil set 30 and a magnitude of the second exciting current I2 to the second superconducting coil set 40 can be controlled independently of each other.

Figure 3A:
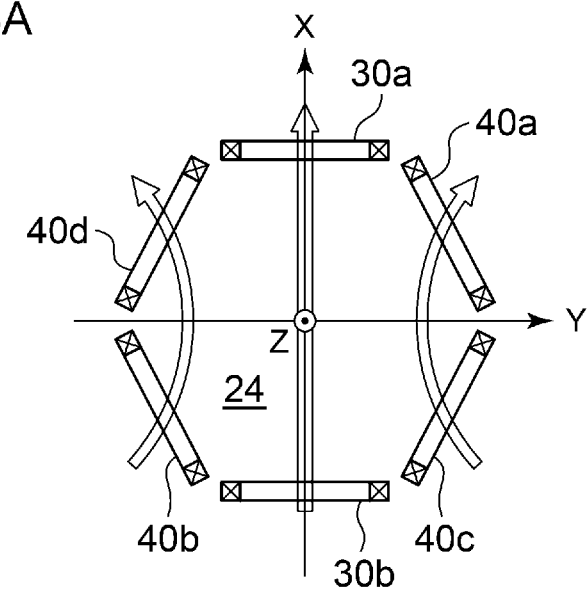
FIG. 3A to FIG. 3C are diagrams schematically showing magnetic field distributions generated by the superconducting magnet device according to the embodiment.
Figure 3B:
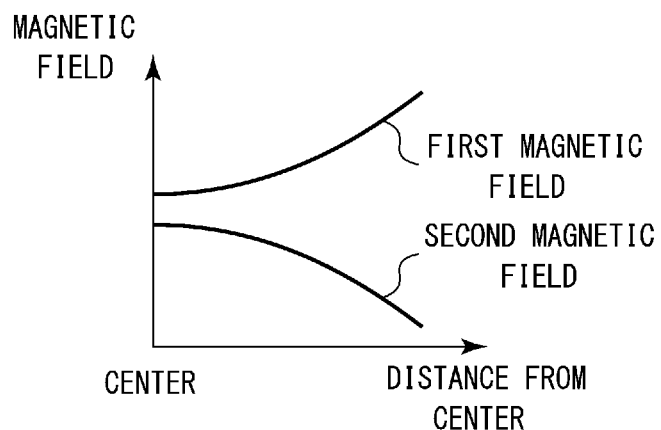
Figure 3C:
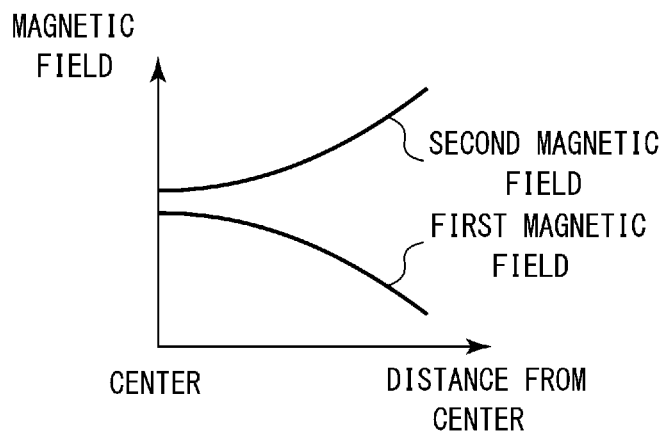

FIG. 3A to FIG. 3C are diagrams schematically showing magnetic field distributions generated by the superconducting magnet device 10 according to the embodiment. FIG. 3A shows the lines of magnetic forces passing through the centers of the respective superconducting coils, which are indicated by arrows and represent the magnetic field distributions generated in the central cavity 24 by the first superconducting coil set 30 and the second superconducting coil set 40, respectively. FIG. 3B shows magnetic flux densities on the X axis for the first superconducting coil set 30 and the second superconducting coil set 40, respectively, and FIG. 3C shows magnetic flux densities on the Y axis for the first superconducting coil set 30 and the second superconducting coil set 40, respectively. The horizontal axes of FIG. 3B and FIG. 3C indicate the distance from the origin of the XYZ coordinate system (in the case of the single crystal pulling device, the distance from the center of the melt surface).

The coil disposition of the first superconducting coil set 30 and the second superconducting coil set 40 and the magnetic field distributions to be generated will be described with reference to FIG. 1, FIG. 2, and FIG. 3A to FIG. 3C.

The superconducting magnet device 10 is provided with six superconducting coils, two of which form the first superconducting coil set 30 and the other four of which form the second superconducting coil set 40. As shown in the figure, the respective superconducting coils of the first superconducting coil set 30 and the second superconducting coil set 40 have the same shape and the same size, and in this example, the superconducting coils are circular coils having the same diameter. Thus, the six superconducting coils are disposed in a regular hexagonal shape when viewed from above.

The first superconducting coil set 30 includes a pair of first superconducting coils 30a and 30b disposed to face each other on the X axis with the central cavity 24 interposed therebetween. The pair of first superconducting coils 30a and 30b are disposed such that each coil center axis coincides with the X axis. The direction of the first exciting current I1 supplied to one first superconducting coil (30a in this example) is determined such that this superconducting coil generates a radially outward magnetic field (a magnetic field in the direction of exiting the central cavity 24 through the coil). The direction of the first exciting current I1 supplied to the other first superconducting coil (30b in this example) is determined such that the superconducting coil generates a radially inward magnetic field (a magnetic field in the direction of entering the central cavity 24 through the coil). Thus, as shown in FIG. 3A, the lines of magnetic forces passing through the centers of the first superconducting coils 30a and 30b extend linearly along the X axis.

A first magnetic field generated by the first superconducting coil set 30 is the strongest at the centers of the first superconducting coils 30a and 30b and becomes weaker toward the center of the central cavity 24 along the X axis from the centers (that is, moving away from the coil centers). Thus, as shown in FIG. 3B, the first magnetic field generated by the first superconducting coil set 30 is convex downward on the X axis.

Additionally, as shown in FIG. 3C, the first magnetic field generated by the first superconducting coil set 30 is convex upward on the Y axis. This is because the distances from the centers of the first superconducting coils 30a and 30b increase when the center of the central cavity 24 is outward along the Y axis, so that the first magnetic field generated by the first superconducting coil set 30 is strongest at the center of the central cavity 24 and becomes weaker moving outward from the center.

The second superconducting coil set 40 includes a pair of second superconducting coils 40a and 40b disposed to face each other with the central cavity 24 interposed therebetween and disposed adjacent to the pair of first superconducting coils 30a and 30b in a clockwise direction around the Z axis, and another pair of second superconducting coils 40c and 40d disposed to face each other with the central cavity 24 interposed therebetween and disposed adjacent to the pair of first superconducting coils 30a and 30b in a counterclockwise direction around the Z axis. In this embodiment, as shown in FIG. 1, the first pair of second superconducting coils 40a and 40b are disposed such that each coil center axis coincides with a line 42 forming 60 degrees from the X axis clockwise around the Z axis, and the second pair of second superconducting coils 40c and 40d are disposed such that each coil center axis coincides with a line 44 forming 60 degrees from the X axis counterclockwise around the Z axis.

The direction of the second exciting current I2 supplied to the second superconducting coils (40a and 40d in this example) adjacent to both sides of the one first superconducting coil (30a in this example) that generates the radially outward magnetic field is determined such that these two second superconducting coils also generate the radially outward magnetic field. The direction of the second exciting current I2 supplied to the second superconducting coils (40b and 40c in this example) adjacent to both sides of the other first superconducting coil (30b in this example) that generates the radially inward magnetic field is determined such that these two second superconducting coils also generate the radially inward magnetic field. For that reason, as shown in FIG. 3A, the lines of magnetic forces passing through the centers of the two second superconducting coils (40a and 40c, or 40b and 40d) adjacent to each other are curved to enter the central cavity 24 through one of the two second superconducting coils and to exit the central cavity 24 through the other second superconducting coil.

A second magnetic field generated by the second superconducting coil set 40 is the strongest in a curved magnetic field line passing through the coil center and becomes weaker moving outward from the coil center. Thus, the second magnetic field is relatively strong at the center of the central cavity 24 on the X axis and becomes weaker moving outward along the X axis from the center. That is, as shown in FIG. 3B, the second magnetic field is convex upward on the X axis. Additionally, the second magnetic field is relatively weak at the center of the central cavity 24 on the Y axis and becomes stronger moving outward along the Y axis from the center. That is, as shown in FIG. 3C, the second magnetic field is convex downward on the Y axis.

Figure 4A:
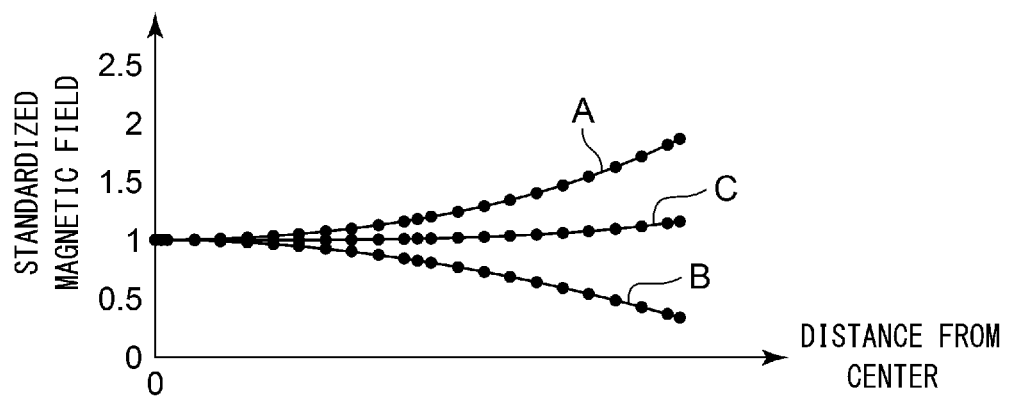
FIG. 4A and FIG. 4B are graphs illustrating a magnetic field distribution in which the magnetic fields generated by a first superconducting coil set and a second superconducting coil set overlap each other.
Figure 4B:
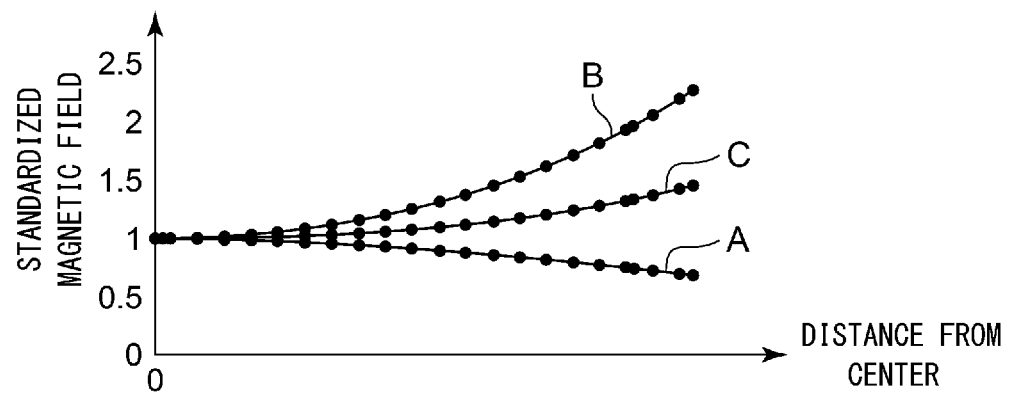

FIG. 4A and FIG. 4B are graphs illustrating a magnetic field distribution in which the magnetic fields generated by the first superconducting coil set 30 and the second superconducting coil set 40 overlap each other. FIG. 4A shows a magnetic flux density on the X axis, and FIG. 4B shows a magnetic flux density on the Y axis. All of the densities are calculation results by the inventor. The vertical axis of the graph represents the magnetic flux density standardized with the magnetic flux density at the center of the central cavity 24 as 1, and the horizontal axis represents the distance from the center of the central cavity 24.

FIG. 4A and FIG. 4B show three cases where the ratios of the first exciting current I1 to the first superconducting coil set 30 and of the second exciting current I2 to the second superconducting coil set 40 are made different. Case A is a case where the ratio of the first exciting current I1 to the second exciting current I2 is set to 1:0, that is, a case where a current flows only through the first superconducting coil set 30 and no current flows through the second superconducting coil set 40. In this case, since only the first superconducting coil set 30 generates a magnetic field, the magnetic field distribution that is convex downward on the X axis and convex upward on the Y axis can be obtained as described above. Case B is a case where the ratio of the first exciting current I1 to the second exciting current I2 is set to 0:1, that is, no current flows through the first superconducting coil set 30 and a current flows only through the second superconducting coil set 40. In this case, only the second superconducting coil set 40 generates a magnetic field, and as described above, the magnetic field distribution that is convex upward on the X axis and convex downward on the Y axis is obtained.

Case C is a case where the ratio of the first exciting current I1 to the second exciting current I2 is set to 1:1, that is, a case where currents of the same magnitude flow through the first superconducting coil set 30 and the second superconducting coil set 40. In Case C, as shown in FIGS. 4A and 4B, a magnetic field distribution having a convex shape obtained by averaging Case A and Case B is obtained. Similarly, in a case where the ratio of the first exciting current I1 to the second exciting current I2 is set to another value, it is considered that a magnetic field distribution having a convex shape between Cases A and B can be obtained depending on the ratio.

In this way, the convex shape of the magnetic field distribution generated by the first superconducting coil set 30 in the central cavity 24 can be changed by changing the magnitude of the first exciting current I1, and the convex shape of the magnetic field distribution generated by the second superconducting coil set 40 in the central cavity 24 can be changed by changing the size of the second exciting current I2.

It is known that the magnetic field distribution of the first superconducting coil set 30 (the magnetic field distribution that is convex downward on the X axis and convex upward on the Y axis) is suitable for producing a single crystal having a relatively high oxygen concentration and that the magnetic field distribution of the second superconducting coil set 40 (the magnetic field distribution that is convex upward on the X axis and convex downward on the Y axis) is suitable for producing a single crystal having a relatively low oxygen concentration. The desired oxygen concentration varies depending on the applications of semiconductor devices that are ultimately manufactured. For example, so-called horizontal devices such as CPUs and memories and vertical devices such as power devices require different oxygen concentrations.

According to the superconducting magnet device 10 according to the embodiment, by controlling the first exciting current I1 and the second exciting current I2 independently of each other, it is possible to control the convex shape of the magnetic field distribution of the central cavity 24, which is the overlap of the magnetic fields generated by the first superconducting coil set 30 and the second superconducting coil set 40, respectively.

In the related-art device, only a single magnetic field distribution can be generated, or it is only possible to switch between two types of magnetic field distributions, and there is a limit to the improvement of crystal quality. In contrast, the superconducting magnet device 10 according to the embodiment can more finely control the magnetic field distribution to be generated. Accordingly, the degree of suppression of heat convection in the melt can be finely adjusted, the oxygen concentration in the single crystal can be more finely adjusted, and the crystal quality can be improved.

The single crystal pulling device mounted with the superconducting magnet device 10 according to the embodiment can be used to manufacture single crystals having various oxygen concentrations desired depending on final products. The single crystal pulling device according to the embodiment has an improved operation rate at a manufacturing site as compared to the related-art device and enables more economical factory management.

Figure 5:
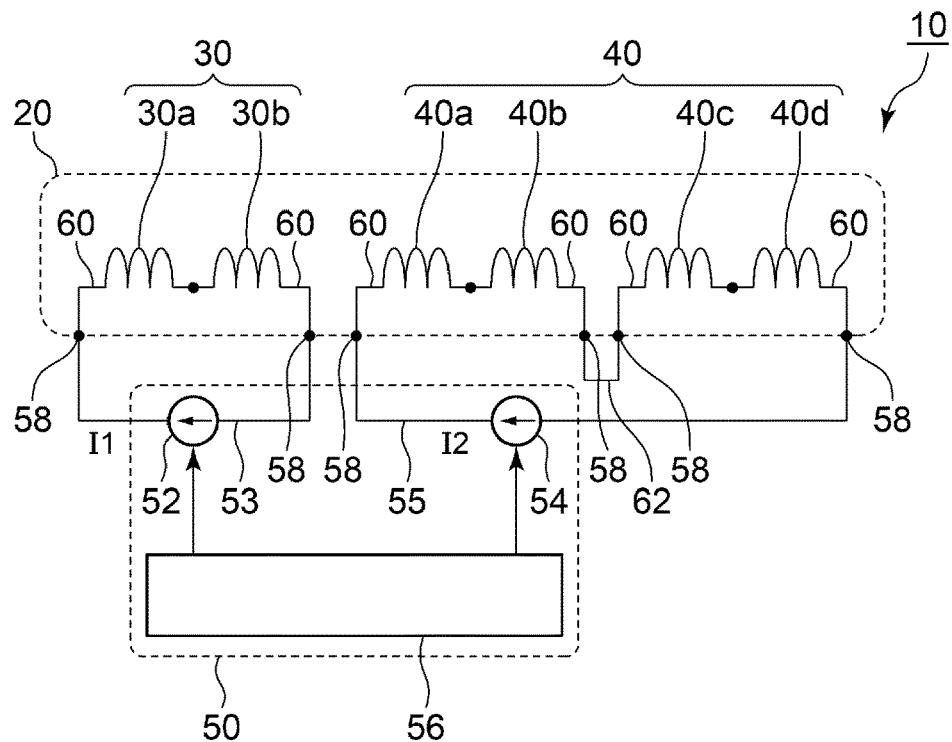
FIG. 5 is a diagram schematically showing an example of a coil power supply circuit of the superconducting magnet device shown in FIG. 1.

FIG. 5 is a diagram schematically showing an example of a coil power supply circuit of the superconducting magnet device 10 shown in FIG. 1. The power supply system 50 includes a first power supply 52 that supplies the first exciting current I1 to the first superconducting coil set 30, a second power supply 54 that supplies the second exciting current I2 to the second superconducting coil set 40, and a power supply controller 56 that controls the first power supply 52 and the second power supply 54.

As described above, the first superconducting coil set 30 is disposed inside the tubular cryostat 20, and the power supply system 50 is disposed outside the tubular cryostat 20. For that reason, a first circuit 53 that connects the first power supply 52 to the first superconducting coil set 30 has feedthrough portions 58 on a positive electrode side and a negative electrode side, respectively. Each feedthrough portion 58 is an airtight terminal for introducing a current into the tubular cryostat 20 and is provided so as to penetrate a wall surface of the tubular cryostat 20. The two feedthrough portions 58 are connected to corresponding current lead portions 60, respectively. The pair of first superconducting coils 30a and 30b are connected in series in the tubular cryostat 20. A positive electrode of the first power supply 52 is connected to one first superconducting coil 30a via one feedthrough portion 58 and one current lead portion 60, and the other first superconducting coil 30b is connected to a negative electrode of the first power supply 52 via the other feedthrough portion 58 and the other current lead portion 60 to form the first circuit 53.

In a second circuit 55 connecting the second power supply 54 to the second superconducting coil set 40, a positive electrode of the second power supply 54 is connected to the first pair of second superconducting coils 40a and 40b via the feedthrough portion 58 and the current lead portion 60. The first pair of second superconducting coils 40a and 40b are connected in series in the tubular cryostat 20. The first pair of second superconducting coils 40a and 40b and the second pair of second superconducting coils 40c and 40d are connected to each other via the current lead portion 60 and the feedthrough portion 58 on a first pair side, an external wiring line 62 that connects the two feedthrough portions 58 outside the tubular cryostat 20, and the current lead portion 60 and the feedthrough portion 58 on a second pair side. The second pair of second superconducting coils 40c and 40d are connected in series in the tubular cryostat 20. The second pair of second superconducting coil 40c and 40d are connected to a negative electrode of the second power supply 54 via the feedthrough portion 58 and the current lead portion 60.

Accordingly, the first power supply 52 can supply the first exciting current I1 to the first superconducting coil set 30 via the first circuit 53, and the second power supply 54 can supply the second exciting current I2 to the second superconducting coil set 40 via the second circuit 55. The first circuit 53 and the second circuit 55 are not connected to each other.

The power supply controller 56 can determine the first exciting current I1 and the second exciting current I2 so as to realize a desired magnetic field distribution. Here, the power supply controller 56 may control the magnitude of the first exciting current I1 and the magnitude of the second exciting current I2 such that the total value of the magnetic fields generated at a predetermined position (for example, the center) in the central cavity 24 by the first superconducting coil set 30 and the second superconducting coil set 40 does not exceed an upper limit value.

Figure 6:
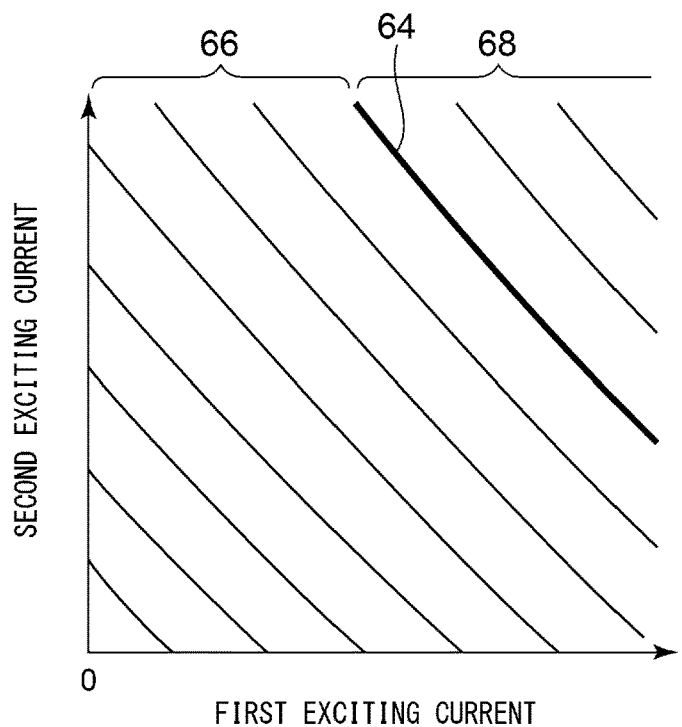
FIG. 6 is a graph showing an example of a contour diagram of a magnetic field generated by the superconducting magnet device according to the embodiment, with a first exciting current and a second exciting current as the horizontal axis and the vertical axis, respectively.

FIG. 6 is a graph showing an example of a contour diagram of a magnetic field generated by the superconducting magnet device 10 according to the embodiment, with the first exciting current I1 and the second exciting current I2 as the horizontal axis and the vertical axis, respectively. A magnetic field value shown in the graph indicates the total value of the magnetic fields generated at a predetermined position (for example, the center) in the central cavity 24 by the first superconducting coil set 30 and the second superconducting coil set 40. In this example, an upper right contour line has a larger magnetic field value, and a lower left contour line has a smaller magnetic field value.

The power supply controller 56 may select a contour line 64 (indicated by a thick line) from a plurality of contour lines and may determine the combination of the first exciting current I1 and the second exciting current I2 from a region 66 that gives a magnetic field value of the selected contour line 64 or a magnetic field value lower than that. That is, determining the first exciting current I1 and the second exciting current I2 from a region 68 that gives a magnetic field value higher than the selected contour line 64 is prohibited. The magnetic field value of the contour line 64 to be selected may be appropriately defined as a specification of the superconducting magnet device 10 or of the single crystal pulling device and may be input to or stored in the power supply controller 56.

In this way, it is possible to avoid that the excessive magnitudes of first exciting current I1 and second exciting current I2, which generate a magnetic field exceeding the magnetic field value corresponding to the selected contour line 64, are supplied to the first superconducting coil set 30 and the second superconducting coil set 40. By avoiding excessive current supply to the superconducting coil, the electromagnetic force and heat load acting on the coil can be suppressed, and the risk of breaking the superconductivity can be reduced. The superconducting magnet device 10 can be more safely operated.

Figure 7:
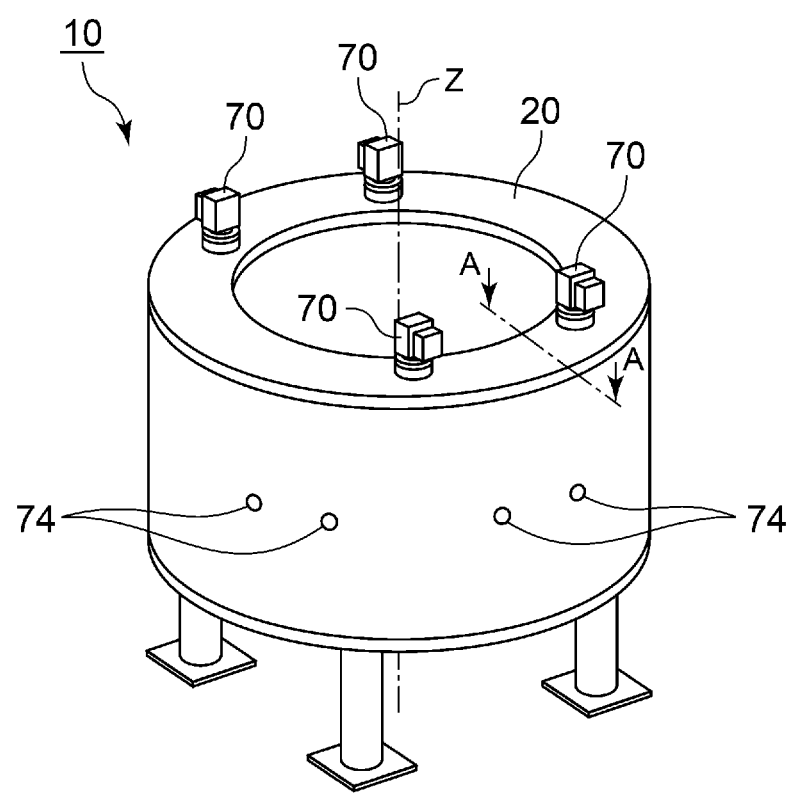
FIG. 7 is a perspective view schematically showing the appearance of the superconducting magnet device.
Figure 8A:
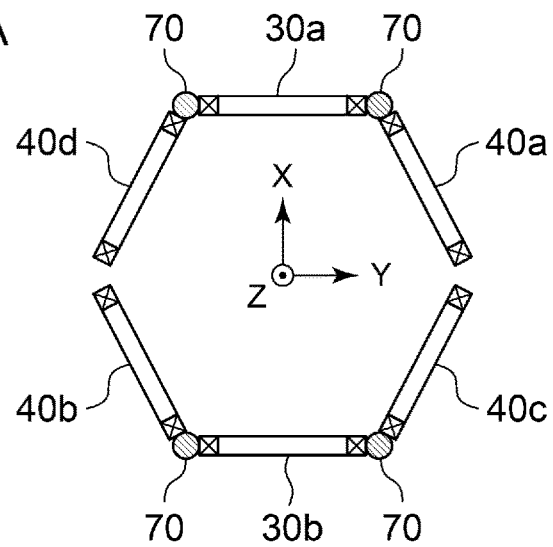
FIG. 8A to FIG. 8C are schematic views illustrating the disposition location of a cryocooler in the superconducting magnet device shown in FIG. 7.
Figure 8B:
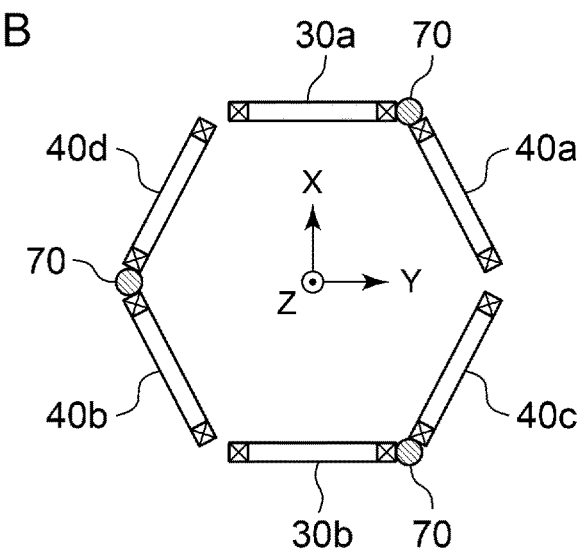
Figure 8C:
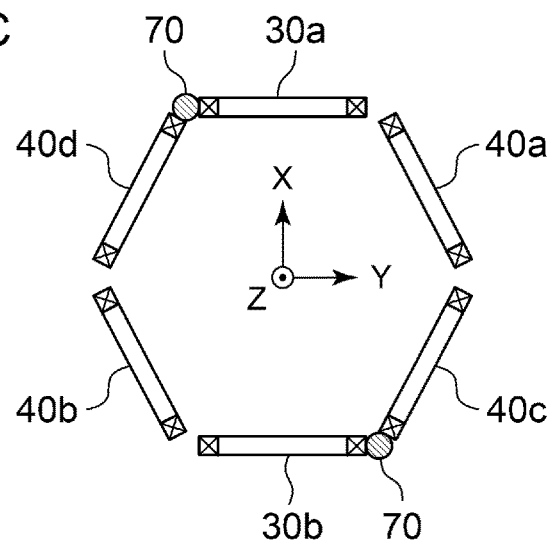

FIG. 7 is a perspective view schematically showing the appearance of the superconducting magnet device 10. FIG. 8A to FIG. 8C are schematic views illustrating the disposition location of a cryocooler in the superconducting magnet device 10 shown in FIG. 7.

As shown in FIG. 7, the superconducting magnet device 10 includes at least one cryocooler 70, and the first superconducting coil set 30 and the second superconducting coil set 40 disposed in the tubular cryostat 20 are thermally coupled to the cryocooler 70. The cryocooler 70 may be, for example, a two-stage Gifford-McMahon (GM) cryocooler or another type of cryocooler. Each superconducting coil is used in a state of being cooled to a cryogenic temperature equal to or lower than the superconducting transition temperature by the cryocooler 70. In this embodiment, the superconducting magnet device 10 is configured as a so-called conduction cooling type in which the superconducting coil is directly cooled by the cryocooler 70 instead of being immersed in a cryogenic liquid refrigerant such as liquid helium.

In the example shown in FIG. 7, four cryocoolers 70 are installed on an upper surface of the tubular cryostat 20. The cryocooler 70 may be disposed between two superconducting coils adjacent to each other around the Z axis when viewed from the Z axis. By installing the cryocooler 70 using an empty space between the coils, the tubular cryostat 20 can be more compactly designed, and the superconducting magnet device 10 can be downsized.

As shown in FIG. 8A, the first cryocooler 70 may be disposed between the first superconducting coil 30a and the second superconducting coil 40a, the second cryocooler 70 may be disposed between the first superconducting coil 30a and the second superconducting coil 40d, the third cryocooler 70 may be disposed between the first superconducting coil 30b and the second superconducting coil 40b, and the fourth cryocooler 70 may be disposed between the first superconducting coil 30b and the second superconducting coil 40c. In this way, each superconducting coil may be directly cooled by any cryocooler 70.

The cryocooler 70 to be installed in the tubular cryostat 20 may be smaller. For example, as shown in FIG. 8B, three cryocoolers 70 may be installed in the tubular cryostat 20, and each cryocooler 70 may be disposed between two superconducting coils adjacent to each other around the Z axis. In this case, as shown in the figure, the cryocoolers 70 may be disposed at equal angular intervals around the Z axis.

Alternatively, as shown in FIG. 8C, two cryocoolers 70 may be installed in the tubular cryostat 20 and may be disposed at intervals of 180 degrees around the Z axis. In the shown example, the first cryocooler 70 is disposed between the first superconducting coil 30a and the second superconducting coil 40d, and the second cryocooler 70 is disposed between the first superconducting coil 30b and the second superconducting coil 40c. In this case, some superconducting coils (for example, the second superconducting coils 40a and 40b) are disposed farther from the cryocooler 70 than other superconducting coils adjacent to the cryocooler 70. The superconducting coils (40a and 40b) may be connected to the cryocooler 70 (or the superconducting coils adjacent to the cryocooler 70) via an appropriate heat transfer member and may be cooled.

Alternatively, more cryocoolers 70 may be installed in the tubular cryostat 20 as necessary. For example, a cryocooler 70 may be provided for each superconducting coil. One superconducting coil may be cooled by a plurality of cryocoolers 70.

Figure 9:
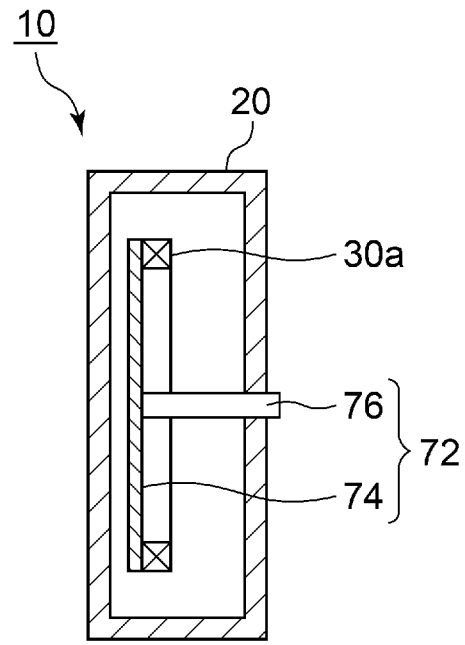
FIG. 9 is a sectional view schematically showing a coil supporting structure of the superconducting magnet device.

FIG. 9 is a sectional view schematically showing a coil supporting structure 72 of the superconducting magnet device 10. FIG. 9 shows a section taken along line A-A of FIG. 7. The coil supporting structure 72 connects a superconducting coil (the first superconducting coil 30a in the illustrated example) belonging to the first superconducting coil set 30 or the second superconducting coil set 40 to the tubular cryostat 20 and supports the weight acting on the superconducting coil and the electromagnetic force generated during operation. As shown in FIG. 9, the coil supporting structure 72 includes a coil supporting plate 74 and a coil supporting body 76. The coil supporting plate 74 is provided for connecting the superconducting coil and the coil supporting body 76 to each other and is attached to one side (for example, an inner peripheral side of the tubular cryostat 20) of the superconducting coil.

The coil supporting body 76 supports the superconducting coil on a peripheral surface (for example, an outer peripheral surface) of the tubular cryostat 20 and is disposed inside the superconducting coil. One end of the coil supporting body 76 is attached to the coil supporting plate 74 inside the superconducting coil, and the other end thereof is attached to the outer peripheral surface of the tubular cryostat 20. The coil supporting body 76 has a rod shape and extends in a horizontal direction. FIG. 7 shows an end portion of the coil supporting body 76 provided on the outer peripheral surface of the tubular cryostat 20. One superconducting coil may be supported on the tubular cryostat 20 by a plurality of (for example, two) coil supporting bodies 76.

Figure 10:
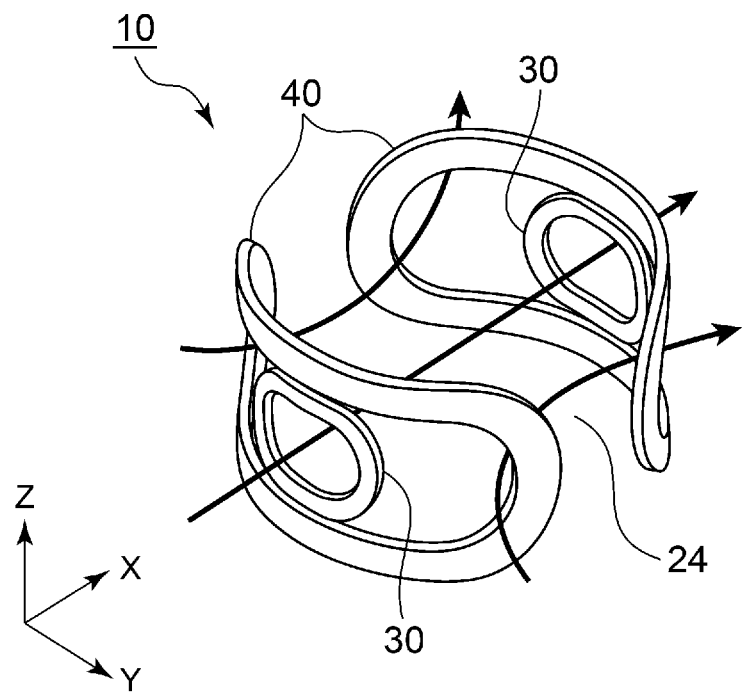
FIG. 10 is a perspective view schematically showing another example of the superconducting coil disposition in the superconducting magnet device according to the embodiment.

FIG. 10 is a perspective view schematically showing another example of the superconducting coil disposition in the superconducting magnet device 10 according to the embodiment. As shown in the figure, two types of saddle-shaped coils having different sizes may be used in the superconducting magnet device 10.

The first superconducting coil set 30 includes a pair of first superconducting coils disposed to face each other on the X axis with the central cavity 24 interposed therebetween. The second superconducting coil set 40 includes a pair of second superconducting coils disposed to face each other on the X axis with the central cavity 24 interposed therebetween. The pair of first superconducting coils are disposed inside the pair of second superconducting coils.

Even in a case where such a double saddle-shaped coil disposition is used, similar to the above-described 6-coil type, the first superconducting coil set 30 generates a magnetic field distribution, which is convex downward on the X axis and convex upward on the Y axis when the first exciting current I1 is supplied, in the central cavity 24, and the second superconducting coil set 40 generates a magnetic field distribution, which is convex upward on the X axis and convex downward on the Y axis when the second exciting current I2 is supplied, in the central cavity 24. By controlling the first exciting current I1 and the second exciting current I2 independently of each other, it is possible to control the convex shape of the magnetic field distribution of the central cavity 24, which is the overlap of the magnetic fields generated by the first superconducting coil set 30 and the second superconducting coil set 40, respectively.

The present invention has been described above on the basis of the embodiment. It should be understood by those skilled in the art that the present invention is not limited to the above embodiment, that various design changes are possible and various modification examples are possible, and that such modification examples are also within the scope of the present invention. Various features described in relation to a certain embodiment can also be applied to other embodiments. New embodiments created by combination have the effects of respective combined embodiments in combination.

In the above-described 6-coil type embodiment, all superconducting coils have the same shape and size, but this is not indispensable. For example, in the first superconducting coil set 30 and the second superconducting coil set 40, the superconducting coils may have different shapes and/or different sizes.

The power supply system 50 may change the direction of the first exciting current I1 and/or the second exciting current I2 in addition to or instead of changing the magnitude of the first exciting current I1 and/or the second exciting current I2.

The single crystal pulling device on which the superconducting magnet device 10 according to the embodiment is mounted may be a single crystal pulling device for producing a single crystal of a semiconductor material other than silicon or of other materials.

If applicable, the superconducting magnet device 10 may be mounted on a device other than the single crystal pulling device. The superconducting magnet device 10 may be mounted on a high-magnetic-field utilization device as a magnetic field source of the high-magnetic-field utilization device and can generate a high magnetic field required for the device.

The present invention has been described using specific terms and phrases based on the embodiments, but the embodiments show only one aspect of the principles and applications of the present invention. In the embodiments, many modification examples and disposition changes are permitted within a range not departing from the concept of the present invention defined in the claims.

It should be understood that the invention is not limited to the above-described embodiment, but may be modified into various forms on the basis of the spirit of the invention. Additionally, the modifications are included in the scope of the invention.

What is claimed is:

1. A superconducting magnet device comprising:
a tubular cryostat that defines a central cavity therein;
a first superconducting coil set and a second superconducting coil set that are disposed outside the central cavity and inside the tubular cryostat; and
a power supply system that is capable of controlling a magnitude of a first exciting current to the first superconducting coil set and a magnitude of a second exciting current to the second superconducting coil set independently of each other,
wherein when a center axis of the tubular cryostat is defined as a Z axis and two axes perpendicular to the Z axis and perpendicular to each other are defined as an X axis and a Y axis, respectively,
the first superconducting coil set includes a pair of first superconducting coils disposed to face each other on the X axis with the central cavity interposed therebetween, and
the second superconducting coil set includes a pair of second superconducting coils disposed to face each other with the central cavity interposed therebetween and disposed adjacent to the pair of first superconducting coils in a clockwise direction around the Z axis, and another pair of second superconducting coils disposed to face each other with the central cavity interposed therebetween and disposed adjacent to the pair of first superconducting coils in a counterclockwise direction around the Z axis,
wherein the superconducting magnet device further comprises:
a coil supporting plate attached to a superconducting coil belonging to the first superconducting coil set or the second superconducting coil set, and
a coil supporting body that supports the superconducting coil on a peripheral surface of the tubular cryostat and is disposed inside the superconducting coil, one end of the coil supporting body attached to the coil supporting plate and an opposite end of the coil supporting body attached to the peripheral surface of the tubular cryostat.

2. The superconducting magnet device according to claim 1,
wherein the one pair of second superconducting coils are disposed on a line forming an angle of 60 degrees from the X axis clockwise around the Z axis, and the other pair of second superconducting coils are disposed on a line forming an angle of 60 degrees from the X axis counterclockwise around the Z axis.

3. The superconducting magnet device according to claim 1, further comprising:
at least one cryocooler that cools the first superconducting coil set and the second superconducting coil set,
wherein the at least one cryocooler is disposed between two superconducting coils adjacent to each other around the Z axis when viewed from the Z axis.

4. The superconducting magnet device according to claim 1,
wherein the power supply system includes a first power supply that supplies the first exciting current to each superconducting coil of the first superconducting coil set and a second power supply that supplies the second exciting current to each superconducting coil of the second superconducting coil set.

5. The superconducting magnet device according to claim 1,
wherein the power supply system includes a power supply controller that controls the magnitude of the first exciting current and the magnitude of the second exciting current such that a total value of magnetic fields generated at a predetermined position in the central cavity by the first superconducting coil set and the second superconducting coil set does not exceed an upper limit value.

6. The superconducting magnet device according to claim 1, wherein the coil supporting body has a rod shape and extends in a horizontal direction.

7. The superconducting magnet device according to claim 4, wherein the first superconducting coil set includes a pair of first superconducting coils connected in series in the tubular cryostat,
the power supply system further comprises a first circuit connecting the first power supply to the first superconducting coil set, the first circuit comprising a positive feedthrough terminal and a negative feedthrough terminal that introduce the first exciting current into the tubular cryostat, the positive feedthrough terminal and the negative feedthrough terminal configured to provide airtightness of the tubular cryostat,
a positive electrode of the first power supply is connected to one of the pair of first superconducting coils via the positive feedthrough terminal and a negative electrode of the first power supply is connected to the other one of the pair of first superconducting coils via the negative feedthrough terminal.

8. The superconducting magnet device according to claim 4, wherein the second superconducting coil set includes a first pair of second superconducting coils connected in series in the tubular cryostat,
the power supply system further comprises a second circuit connecting the second power supply to the second superconducting coil set, the second circuit comprising a positive feedthrough terminal that introduces the second exciting current into the tubular cryostat, the positive feedthrough terminal configured to provide airtightness of the tubular cryostat,
a positive electrode of the second power supply is connected to the first pair of second superconducting coils via the positive feedthrough terminal.

9. The superconducting magnet device according to claim 8, wherein the second superconducting coil set further includes a second pair of second superconducting coils connected in series in the tubular cryostat,
the second circuit comprises a negative feedthrough terminal that introduces the second exciting current into the tubular cryostat, the negative feedthrough terminal configured to provide airtightness of the tubular cryostat,
a negative electrode of the second power supply is connected to the second pair of second superconducting coils via the negative feedthrough terminal.

* * * * *